United States Patent
Yoo et al.

(10) Patent No.: US 8,124,960 B2
(45) Date of Patent: Feb. 28, 2012

(54) NITRIDE SEMICONDUCTOR LIGHT EMITTING DIODE

(75) Inventors: Sang-Duk Yoo, Seongnam-si (KR); Ho-Il Jung, Suwon-si (KR); Chul-Kyu Lee, Seoul (KR); Sung-Hwan Jang, Yongin-si (KR); Won-Shin Lee, Suwon-si (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 231 days.

(21) Appl. No.: 12/685,361

(22) Filed: Jan. 11, 2010

(65) Prior Publication Data

US 2010/0176372 A1    Jul. 15, 2010

(30) Foreign Application Priority Data

Jan. 9, 2009    (KR) .................. 10-2009-0001806

(51) Int. Cl.
*H01L 33/00* (2010.01)

(52) U.S. Cl. ............. 257/14; 257/12; 257/13; 257/15; 257/79; 257/E33.008

(58) Field of Classification Search .............. 257/12–15, 257/79, E33.008
See application file for complete search history.

(56) References Cited

U.S. PATENT DOCUMENTS

| | | | |
|---|---|---|---|
| 2002/0117674 A1* | 8/2002 | Sugawara | 257/79 |
| 2008/0230794 A1* | 9/2008 | Yasuda et al. | 257/96 |
| 2010/0288999 A1* | 11/2010 | Kikuchi et al. | 257/13 |

* cited by examiner

*Primary Examiner* — Cuong Q Nguyen
*Assistant Examiner* — Tran Tran
(74) *Attorney, Agent, or Firm* — McDermott Will & Emery LLP

(57) ABSTRACT

A nitride semiconductor light emitting diode (LED) is disclosed. The nitride semiconductor LED can include an active layer formed between an n-type nitride layer and a p-type nitride layer, where the active layer includes two or more quantum well layers and quantum barrier layers formed in alternation, and the quantum barrier layer formed adjacent to the p-type nitride layer is thinner than the remaining quantum barrier layers. An embodiment of the invention can be used to improve optical efficiency while providing crystallinity in the active layer.

4 Claims, 2 Drawing Sheets

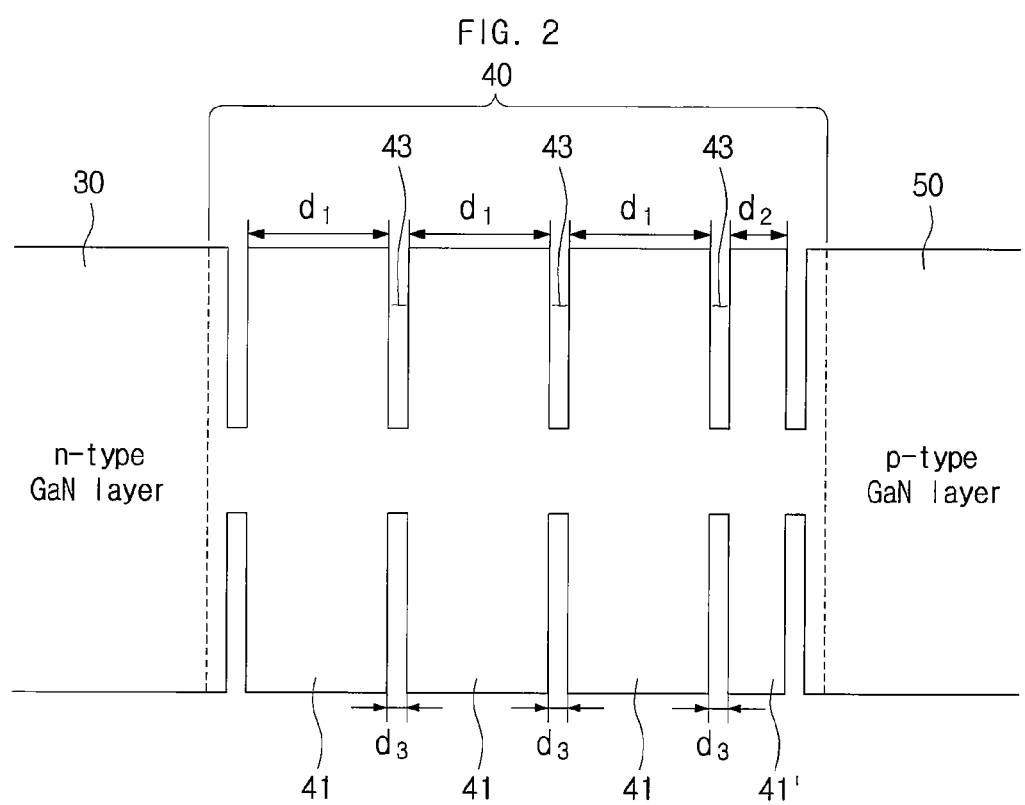

NITRIDE SEMICONDUCTOR LIGHT EMITTING DIODE

CROSS-REFERENCE TO RELATED APPLICATIONS

This application claims the benefit of Korean Patent Application No. 10-2009-0001806, filed with the Korean Intellectual Property Office on Jan. 9, 2009, the disclosure of which is incorporated herein by reference in its entirety.

BACKGROUND

1. Technical Field

The present invention relates to a nitride semiconductor LED (light emitting diode).

2. Description of the Related Art

Nitrides of group-III elements, such as gallium nitride (GaN), aluminum nitride (AlN), etc., exhibit high thermal stability and provide a direct transition type energy band structure, and are hence commonly used as materials in photoelectric elements for blue and ultraviolet light. In particular, blue and green light emitting diodes (LED's) that use gallium nitride (GaN) are utilized in a variety of applications, examples of which include large flat panel color displays, traffic lights, interior lighting, high-density light sources, high-resolution output systems, and optical communication.

The structure of a nitride semiconductor LED may include a substrate, a buffer layer, a p-type semiconductor layer, an active layer, an n-type semiconductor layer, and electrodes. The active layer, where the recombination of electrons and electron holes may occur, can include quantum well layers, expressed by the formula $In_xGa_{1-x}N$ ($0 \leq x \leq 1$), and quantum barrier layers. The wavelength of the light emitted from the LED may be determined by the type of material forming the active layer.

The active layer may be of a single quantum well (SQW) structure, which has one quantum well layer, or a multi-quantum well (MQW) structure, which has multiple quantum well layers that are smaller than about 100 Å. The MQW structure in particular can provide higher optical efficiency relative to the electric current and higher light-emission output, compared to the SQW structure.

The optical efficiency of a nitride semiconductor LED may be determined by the recombination probability of electrons and electron holes in the active layer, i.e. the internal quantum efficiency. Various research efforts have focused on improving the internal quantum efficiency by improving the structure of the active layer itself or by increasing the effective mass of the carrier.

Spurred by the increased demands for white LED's, many researchers have worked on developing blue and ultraviolet (UV) LED's based on GaN, and as a result, there have been a geometric growth in the efficiency of blue and UV LED's in the past few years. On the contrary, the lower demands for green LED's have led to a relatively slower growth in green LED development, but it is expected that future developments for multifunctional LED lighting will require efficiency improvements in green LED's as well.

A green LED may generally have a higher indium (In) content compared to a blue or UV LED, and the consequent decrease in crystallinity may severely lower the optical output. While it is necessary to improve the crystallinity of the quantum well layers and quantum barrier layers to resolve this problem, increasing the thickness of the quantum barrier layers, in an attempt to improve the crystallinity, can cause difficulties in the movement of electrons and electron holes required for the emitting of light. Needed therefore is a structure that can improve the crystallinity and at the same time improve the mobility of the electrons and (especially) the electron holes into the light emitting region.

A green LED may have a higher indium content than a blue or UV LED, and this high indium content can cause many defects during the procedure for growing (In)GaN. The defects in the GaN and InGaN layers may lower the light-emitting efficiency of the LED.

SUMMARY

An aspect of the invention provides a nitride semiconductor light emitting diode (LED) that improves optical efficiency while providing crystallinity in an active layer.

Another aspect of the invention provides a nitride semiconductor LED that includes an active layer formed between an n-type nitride layer and a p-type nitride layer, where the active layer includes two or more quantum well layers and quantum barrier layers formed in alternation, and the quantum barrier layer formed adjacent to the p-type nitride layer is thinner than the remaining quantum barrier layers.

Here, the active layer can be configured to emit a green-wavelength light, and the quantum well layers can be formed to have a uniform thickness.

The thickness of a quantum barrier layer formed adjacent to the p-type nitride layer can be smaller than 10 nm, while the thickness or thicknesses of the remaining quantum barrier layer or layers can be greater than or equal to 10 nm and smaller than or equal to 30 nm.

Additional aspects and advantages of the present invention will be set forth in part in the description which follows, and in part will be obvious from the description, or may be learned by practice of the invention.

BRIEF DESCRIPTION OF THE DRAWINGS

FIG. 2 is an energy band diagram illustrating an active layer of a nitride semiconductor LED according to an embodiment of the invention.

DETAILED DESCRIPTION

Figure 1:
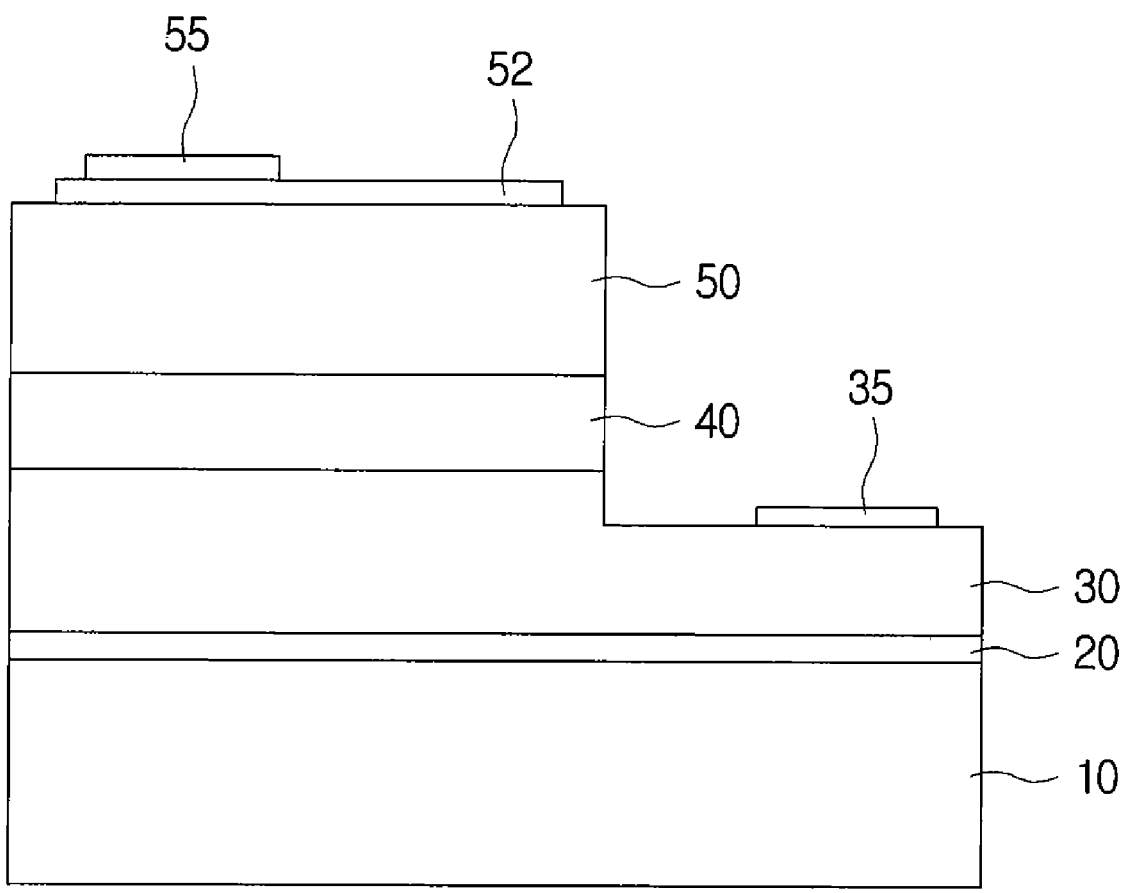
FIG. 1 is a cross-sectional view illustrating a nitride semiconductor light emitting diode.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

The nitride semiconductor LED according to certain embodiments of the invention will be described below in more detail with reference to the accompanying drawings. Those components that are the same or are in correspondence are rendered the same reference numeral regardless of the figure number, and redundant descriptions are omitted.

FIG. 1 is a cross-sectional view illustrating a nitride semiconductor light emitting diode, and FIG. 2 is an energy band diagram illustrating an active layer of a nitride semiconductor LED according to an embodiment of the invention. In FIG. 1 and FIG. 2, there are illustrated a substrate 10, a buffer layer 20, an n-type nitride layer 30, an n-type electrode 35, an active layer 40, quantum barrier layers 41 and 41', quantum well layers 43, a p-type nitride layer 50, a transparent electrode 52, and a p-type electrode 55.

As in the example illustrated in FIGS. 1 and 2, a nitride semiconductor LED according to an embodiment of the invention can include a substrate 10, and a buffer layer 20, an n-type nitride layer 30, an active layer 40, and a p-type nitride layer 50 formed in order over the substrate 10. Portions of the p-type nitride layer 50 and active layer 40 can be removed, using a mesa etching process, for example, to form a structure in which a portion of the upper surface of the n-type nitride layer 30 is exposed.

An n-type electrode 35 can be formed over an exposed portion of the n-type nitride layer 30. Also, a transparent electrode 52 made from ITO (indium-tin oxide), etc., can be formed over the p-type nitride layer 50, and a P-type electrode 55 can be formed over the transparent electrode 52.

The substrate 10 can be made from a material suitable for growing nitride semiconductor monocrystals. For example, the substrate 10 may be formed using a material such as sapphire, as well as zinc oxide (ZnO), gallium nitride (GaN), silicon carbide (SiC), aluminum nitride (AlN), etc.

The buffer layer 20 can serve to reduce the difference between the lattice constants of the substrate 10 and the n-type nitride layer 30, which will be described later in greater detail. The buffer layer 20 can be made from a material such as GaN, AlN, AlGaN, InGaN, AlGaInN, etc., or can be omitted depending on the properties of the diode and the conditions for processing.

The n-type nitride layer 30 can be formed over the buffer layer 20. The n-type nitride layer 30 can be formed from a gallium nitride (GaN)-based material, and can be doped with silicon to lower the operating voltage.

The active layer 40 having a multi-quantum well (MQW) structure, in which quantum well layers 43 and quantum barrier layers 41 and 41' are formed alternately, can be formed over the n-type nitride layer 30. Here, the quantum well layers 43 can be made from $In_xGa_{1-x}N$ (0<x<1), while the quantum barrier layers 41 and 41' can be made from GaN or AlGaN. The numbers of quantum well layers 43 and quantum barrier layers 41 and 41' for implementing the MQW structure may vary according to design requirements.

In this embodiment, the active layer 40 can emit a single-wavelength light, for example, a green-wavelength light. The active layer 40 can include two or more quantum well layers 43 and quantum barrier layers 41 and 41' that are formed in alternation to form a multi-quantum well (MQW) structure.

The p-type nitride layer 50 can be formed over the active layer 40. The p-type nitride layer 50 may be a semiconductor layer doped with p-type conductive impurities, such as Mg, Zn, Be, etc. The p-type conductive impurities may also be composed of a p-type AlGaN layer (not shown), formed adjacent to the light-emitting region to serve as an electron-blocking layer (EBL), and a p-type GaN layer (not shown), formed adjacent to the p-type AlGaN layer.

A transparent electrode 52 can be formed over the p-type nitride layer 50. The transparent electrode 52 can be a transmissive layer of an oxide membrane and can be made from ITO, ZnO, $RuO_x$, $TiO_x$, $IrO_x$, etc.

To form an electrode pad, a certain portion from the transparent electrode 52 to the n-type nitride layer 30 can be etched. Then, an n-type electrode 30 can be formed over an exposed part of the n-type nitride layer 30, and a p-type electrode 55 can be formed over the transparent electrode 52.

Since the optical efficiency of a nitride semiconductor LED may be determined by the recombination probability of electrons and electron holes in the active layer 40, i.e. the internal quantum efficiency, obtaining high mobility of the electrons and electron holes can be advantageous to improving optical output. Also, a green LED may have a higher indium (In) content compared to a blue LED or a UV LED, so that the crystallinity may be lower in the active layer. Lower crystallinity in the active layer 40 may result in lower optical output, and thus obtaining crystallinity in the active layer 40 can be advantageous to improving the optical output. However, increasing the thickness of the quantum barrier layers 41 and 41', in order to improve the crystallinity, can cause problems in the movement of electrons and electron holes that is required for the emission of light.

To resolve these problems, this embodiment presents a nitride semiconductor LED having a structure in which the quantum barrier layer 41' formed adjacent to the p-type nitride layer 50 is thinner than the other quantum barrier layers 41. That is, among the many quantum barrier layers 41 and 41' that form the multi-quantum well structure, the quantum barrier layer 41' closest to the p-type nitride layer 50 can be made to have a thickness $d_2$ that is smaller than the thickness $d_1$ of the remaining quantum barrier layers 41, as in the example illustrated in FIG. 2. For example, the thickness $d_2$ of the quantum barrier layer 41' closest to the p-type nitride layer 50 can be less than 10 nm, while the thickness $d_1$ of the remaining quantum barrier layers 41 can be 10 nm or greater, in certain examples lying within a range of 10 nm to 30 nm.

In general, if a quantum barrier layer is less than 10 nm, the mobility of the electron holes may be improved, whereas the crystallinity may be lowered. Conversely, if a quantum barrier layer is thicker than 30 nm, the crystallinity may be increased, but the mobility of the electron holes may be impeded. In particular, a green LED has a much higher In content in the active layer, compared to a blue or UV LED, and thus exhibits low crystallinity. Also, electron holes are generally much less mobile than electrons and may not easily traverse a thick barrier layer, so that the efficiency of light emission based on carrier recombination may be decreased.

It is to be noted that, in a quantum well structure, the light emission occurs mainly at the first one or two layers near the p-type semiconductor. Thus, by giving a thickness of less than 10 nm for only the quantum barrier layer 41' adjacent to the p-type nitride layer 50 and keeping the other quantum barrier layers 41 at thicknesses greater than or equal to 10 nm and smaller than or equal to 30 nm, as in the present embodiment, it is possible to obtain crystallinity, while improving the mobility of electron holes for light emission, to consequently maximize light-emitting efficiency.

Each of the quantum well layers 43 can be formed with a uniform thickness $d_3$, without variations in thickness. A method of controlling the thickness of a quantum barrier layer 41' may include controlling the growth time of the quantum barrier layer 41'.

As described above, in a nitride semiconductor LED according to an embodiment of the invention, the quantum barrier layer 41' closest to the p-type nitride layer 50, which may impede the movement of electron holes from the direction of the p-type nitride layer 50, can be reduced in thickness, to facilitate the movement of electron holes into the light-emitting region. In this way, the recombination probability of electrons and electron holes in the active layer 40 can be increased, and the optical output can be improved.

Furthermore, by changing only the thickness of the quantum barrier layer 41' closest to the p-type nitride layer 50 without changing the thicknesses of the remaining quantum barrier layer 41 or of the quantum well layers 43, i.e. without increasing indium (In) content, the problem of lower crystallinity during the GaN growth may be avoided, and a stable optical output may be obtained.

Thus, an embodiment of the invention can improve the mobility of electron holes without lowering the crystallinity of the active layer 40, to therefore improve optical output.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

Many embodiments other than those set forth above can be found in the appended claims.

What is claimed is:

1. A nitride semiconductor light emitting diode comprising an active layer formed between an n-type nitride layer and a p-type nitride layer, wherein:

the active layer comprises two or more quantum well layers and quantum barrier layers, each of the quantum well layers and quantum barrier layers being formed alternately; and the quantum barrier layer formed adjacent to the p-type nitride layer is thinner than the remaining quantum barrier layers.

2. The nitride semiconductor light emitting diode of claim 1, wherein the active layer is configured to emit a green-wavelength light.

3. The nitride semiconductor light emitting diode of claim 1, wherein:

the quantum barrier layer formed adjacent to the p-type nitride layer has a thickness smaller than 10 nm; and the remaining quantum barrier layer has a thickness greater than or equal to 10 nm and smaller than or equal to 30 nm.

4. The nitride semiconductor light emitting diode of claim 1, wherein the two or more quantum well layers have a uniform thickness.

* * * * *